United States Patent [19]
Tsuchimoto et al.

[11] Patent Number: 6,159,785
[45] Date of Patent: Dec. 12, 2000

[54] SEMICONDUCTOR DEVICE AND MANUFACTURING METHOD THEREOF

[75] Inventors: Junichi Tsuchimoto; Yutaka Inaba; Tamotsu Ogata; Kiyoshi Mori, all of Hyogo, Japan

[73] Assignee: Mitsubishi Denki Kabushiki Kaisha, Tokyo, Japan

[21] Appl. No.: 09/201,832

[22] Filed: Dec. 1, 1998

[30] Foreign Application Priority Data

Aug. 17, 1998 [JP] Japan .................................. 10-230470

[51] Int. Cl.⁷ .............................................. H10L 21/8234
[52] U.S. Cl. .......................... 438/238; 438/253; 438/254
[58] Field of Search .................... 438/253, 254, 438/238

[56] References Cited

U.S. PATENT DOCUMENTS

| | | | |
|---|---|---|---|
| 5,760,434 | 6/1998 | Zahurak et al. | 257/309 |
| 5,792,693 | 8/1998 | Tseng | 438/254 |
| 5,817,555 | 10/1998 | Cho | 438/253 |
| 5,932,906 | 8/1999 | Shimizu | 257/306 |

OTHER PUBLICATIONS

"Growth Mechanism of Polycrystalline Si Films with Hemispherical Grains", Toru Tatsumi, et al., Oyo Butsuri, vol., 61, No. 11, 1992.

*Primary Examiner*—Amir Zarabian
*Assistant Examiner*—Pho Luu
*Attorney, Agent, or Firm*—McDermott, Will & Emery

[57] ABSTRACT

An amorphous silicon film is formed on an interlayer insulating film to cover an upper surface of the interlayer insulating film, and a side surface and a bottom surface of an opening formed at the interlayer insulating film. Phosphorus ions are implanted into the amorphous silicon film. The phosphorous ions are implanted into the amorphous silicon film located on the upper surface of the interlayer insulating film to prevent crystal grains from growing, and thus a polysilicon film having no hemispherical grains is formed. Accordingly, a semiconductor device having capacitors with respective storage nodes adjacent to each other that are electrically isolated properly is obtained.

11 Claims, 13 Drawing Sheets

SEMICONDUCTOR DEVICE AND MANUFACTURING METHOD THEREOF

BACKGROUND OF THE INVENTION

1. Field of the Invention

The present invention relates to semiconductor devices and a method of manufacturing thereof. The invention particularly relates to a semiconductor device including capacitors with respective storage nodes adjacent to each other that are electrically isolated properly, and to a method of manufacturing such a semiconductor device.

2. Description of the Background Art

As miniaturization of semiconductor devices advances, there arises a necessity of securing a sufficient capacitor area of a memory cell of a Dynamic Random Access Memory (hereinafter referred to as "DRAM") in order to obtain a prescribed capacitance. Various structures are proposed including three dimensional structures such as the pin structure and the crown structure as capacitor structures. Another structure is also proposed that is formed by roughening the surface of a capacitor electrode (storage node) to increase the surface area of the capacitor. Here, to roughen (roughening) refers to a process of generating hemispherical grains by growing crystal grains. The storage node having such a roughened surface is formed of a polysilicon film, and particularly referred to as HSG (Hemi Spherical Grained) polysilicon film or rough polysilicon film. Such a structure is hereinafter referred to as HSG polysilicon film. The HSG polysilicon film is obtained by forming an amorphous silicon film and annealing the amorphous silicon film in a disilane ($Si_2H_6$) ambient.

Even if the HSG polysilicon film is applied to a storage node of a capacitor having a relatively simple structure, a sufficient surface area for the capacitor cannot be secured. Therefore, the HSG polysilicon film is applied to a storage node of a capacitor having the cylinder structure or the stacked trench structure for a DRAM which needs higher integration.

A conventional DRAM having a capacitor of the stacked trench structure is hereinafter described based on U.S. Pat. No. 5,760,434. A method of fabricating the DRAM, especially the memory cell portion is described by referring to the drawings attached. Referring to FIG. 19, one MOS transistor including a pair of sources drain regions 104a and 104b, and a gate electrode portion 106 is formed at a main surface of a semiconductor substrate 102 according to the known method. A silicon oxide film 108 is formed to cover gate electrode portion 106. A contact hole that exposes the surface of source-drain region 104b is formed at silicon oxide film 108, and a plug 109 is formed in the contact hole. An interlayer insulating film 110 is further formed on silicon oxide film 108. Prescribed photolithography and processing are applied to interlayer insulating film 110 to generate an opening 112 that exposes the surface of plug 109.

Referring next to FIG. 20, an amorphous silicon film 114 is formed on interlayer insulating film 110 to cover an upper surface of the interlayer insulating film 110, and a side surface and a bottom surface of opening 112 by, for example, CVD (Chemical Vapor Deposition). Referring to FIG. 21, amorphous silicon film 114 is annealed with a prescribed degree of vacuum and at a prescribed temperature to grow crystal grains at the surface of amorphous silicon film 114, and thus an HSG polysilicon film 114a having a roughened surface (hemispherical grains) is formed.

Referring to FIG. 22, HSG polysilicon film 114a formed on the upper surface of interlayer insulating film 110 is removed by, for example, etching. Accordingly, a storage node 116 having a roughened surface (hemispherical grains) in opening 112 is formed.

Referring to FIG. 23, a capacitor dielectric film 118 including a silicon oxide film and a silicon nitride film, for example, is formed on storage node 116. A cell plate 120 formed of a polysilicon film is placed on capacitor dielectric film 118. Storage node 116, capacitor dielectric film 118 and cell plate 120 constitute a capacitor. A main portion of a memory cell of a DRAM having one MOS transistor and one capacitor is thus completed. In the actual manufacturing process, an interlayer insulating film (not shown) is further formed to cover the capacitor, metal interconnection lines (not shown) and the like are formed on the interlayer insulating film, and accordingly, the DRAM is completed.

Problems with the method of manufacturing a DRAM described above are discussed below. The HSG polysilicon film formed on the upper surface of interlayer insulating film 110 is removed in the process illustrated in FIG. 22 in order to fabricate storage node 116 of the capacitor. In this process, if the HSG polysilicon film is removed by etching, silicon film residue 122 could be generated as shown in FIG. 24 by a non-uniform etching due to the hemispherical grains of the HSG polysilicon film, a native oxide film formed at the roughened surface, or the like. As a result, adjacent storage nodes 116 and 116 of the capacitors could be electrically short-circuited.

Even if the silicon residue does not cause the electric short-circuiting of adjacent storage nodes 116 and 116, a protruded portion 124 could be formed at cell plate 120 due to an abnormal growth of the polysilicon film of cell plate 120 located on silicon film residue 122, when cell plate 120 is formed on storage node 116. If an insulating film (not shown) deposited on cell plate 120 have a relatively small thickness, protruded portion 124 is not embedded in the insulating film to be electrically short-circuited with any metal interconnection line (not shown) formed on the insulating film.

SUMMARY OF THE INVENTION

The present invention is made to solve such problems as described above. One object of the present invention is to provide a semiconductor device having capacitors with respective storage nodes adjacent to each other that are electrically isolated from each other. Another object of the invention is to provide a method of manufacturing such a semiconductor device.

A method of manufacturing a semiconductor device according to the first aspect of the present invention includes the steps of: depositing a prescribed film that forms an electrode layer on a semiconductor substrate; roughening (forming hemispherical grains at) a surface of the prescribed film by growing crystal grains at the surface; forming a first electrode layer by removing the prescribed film located at a region other than a prescribed region that forms the electrode layer; forming a second electrode layer on the first electrode layer with a dielectric layer interposed therebetween; and introducing impurities into the prescribed film located at the region other than the prescribed region for preventing crystal grains from growing after depositing the prescribed film and before roughening the surface of the prescribed film.

According to the method of manufacturing the semiconductor device, the surface of the prescribed film located at the region other than the prescribed region that forms the electrode layer is not roughened (does not have hemispherical grains) since impurities that prevent growth of the crystal grains are introduced before roughening the prescribed film. When the prescribed film located at the region other than the region that forms the electrode layer is removed, the etching is performed uniformly and generation of etching residue is restricted. As a result, a semiconductor device including first electrode layers adjacent to each other that are electrically isolated properly can be manufactured.

The manufacturing method preferably includes the steps of: forming an insulating layer at a main surface of the semiconductor substrate before depositing the prescribed film; and forming an opening at the insulating layer. The step of depositing the prescribed film includes a step of depositing the prescribed film on a side surface and a bottom surface of the opening as well as depositing on an upper surface of the insulating layer. The step of introducing impurities includes a step of introducing impurities into the prescribed film located on the upper surface of the insulating layer.

The prescribed film deposited on the side surface and the bottom surface of the opening is roughened, and the prescribed film located on the upper surface of the insulating layer is not roughened. As a result, the first electrode layer that is roughened in the opening is easily formed.

Preferably, the step of introducing impurities includes a step of ion implantation for implanting prescribed impurity ions.

In this case, the impurity ions can be easily implanted without an implantation mask into the prescribed film except for the portion thereof formed on at least the side surface of the opening.

Preferably, the step of implanting ions includes a step of implanting prescribed impurity ions obliquely relative to the semiconductor substrate.

In this case, the impurity ions are prevented from being implanted into the bottom surface portion in the opening, and accordingly the prescribed film formed on the bottom surface of the opening can be roughened easily.

Further, the angle of implantation is preferably selected to allow prescribed impurities to be injected into the prescribed film located at an opening edge of the opening and in the vicinity of the opening edge in the step of implanting ions.

In this case, introduction of impurities deeply into the opening can be restricted effectively to properly roughen the surface of the prescribed film deposited on the side surface and the bottom surface of the opening.

Preferably, the step of implanting ions includes a step of implanting prescribed impurity ions using a mask member formed in the opening only as a mask.

In this case, the mask member can be formed easily to be self-aligned in the opening and introduction of impurity ions into the opening can be appropriately prevented by the mask member. Accordingly, the prescribed film deposited on the side surface and the bottom surface of the opening can be properly roughened.

Preferably, the dose in the step of ion implantation is not less than $1 \times 10^{15}/cm^2$, and not more than $1 \times 10^{16}/cm^2$.

If the dose is less than $1 \times 10^{15}/cm^2$, growth of crystal grains at the prescribed film cannot be restricted sufficiently. If the dose is more than $1 \times 10^{16}/cm^2$, it takes much time to implant impurity ions to adversely affect the productivity.

The manufacturing method preferably includes a step of forming a conductive region of a prescribed conductivity type on the semiconductor substrate before depositing the prescribed film. The step of forming the opening includes a step of exposing a surface of the conductive region. The step of implanting prescribed impurity ions includes implanting impurity ions of a conductivity type which is the same as the prescribed conductivity type of the conductive region.

In this case, a contact resistance between the first electrode layer and the conductive region can be reduced since the conductivity type of impurity ions implanted into the prescribed film is the same as that of the conductive region.

A semiconductor device according to the second aspect of the present invention includes a semiconductor substrate, an insulating layer, an opening, a first electrode layer, and a second electrode layer. The semiconductor substrate has a main surface. The insulating layer is formed at the main surface of the semiconductor substrate. The opening is formed at the insulating layer to expose the main surface of the semiconductor substrate. The first electrode layer is formed on a side surface and a bottom surface of the opening and is roughened (has hemispherical grains). The second electrode layer is formed on the first electrode layer with a dielectric layer interposed therebetween. The size of hemispherical grains formed at a surface of a portion of the first electrode layer located on the side surface of the opening and the size of hemispherical grains formed at a surface of a portion of the first electrode layer located on the bottom surface are different from each other.

The structure of the semiconductor device is achieved by the preferable steps of the manufacturing method of the semiconductor device according to the first aspect of the invention. Specifically, the structure is obtained by depositing a prescribed film that forms an electrode layer on the insulating film to cover an upper surface of the insulating film, and the side surface and the bottom surface of the opening, and introducing impurity ions into the prescribed film located on the upper surface of the insulating layer through the ion implantation step. Depending on the angle of implantation in the ion implantation step, impurity ions could reach the bottom surface of the opening. Therefore, the size of hemispherical grains formed at the portion of the first electrode layer located on the bottom surface of the opening is different from the size of the hemispherical grains formed at the portion located on the side surface.

A semiconductor device according to the third aspect of the invention includes a semiconductor substrate, an insulating layer, an opening, a first electrode layer, and a second electrode layer. The semiconductor substrate has a main surface. The insulating layer is formed at the main surface of the semiconductor substrate. The opening is formed at the insulating layer to expose the main surface of the semiconductor substrate. The first electrode layer is formed on a side surface and a bottom surface of the opening and is roughened (has hemispherical grains). The second electrode layer is formed on the first electrode layer with a dielectric layer interposed therebetween. The size of hemispherical grains formed at a portion of the first electrode layer located at an opening edge of the opening and in the vicinity of the opening edge and the size of hemispherical grains formed at a portion of the first electrode layer other than the portion at the opening edge and in the vicinity of the opening edge are different from each other.

The structure is achieved by more preferable steps of the manufacturing method of the semiconductor device according to the first aspect of the invention. Specifically, the structure is achieved by depositing a prescribed film that forms an electrode layer on the insulating layer to cover an upper surface of the insulating layer, and the side surface and the bottom surface of the opening, and implanting impurity ions into the prescribed film obliquely relative to the semiconductor substrate in the ion implantation step. Depending on the angle of implantation in the ion implantation step, impurity ions could reach the opening edge of the opening and the portion in the vicinity of the opening edge. Therefore, the size of hemispherical grains formed at the portion of the first electrode layer located at the opening edge and in the vicinity of the opening edge and the size of hemispherical grains formed at the portion of the first electrode layer other than the portion at the opening edge and in the vicinity of the opening edge are different from each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
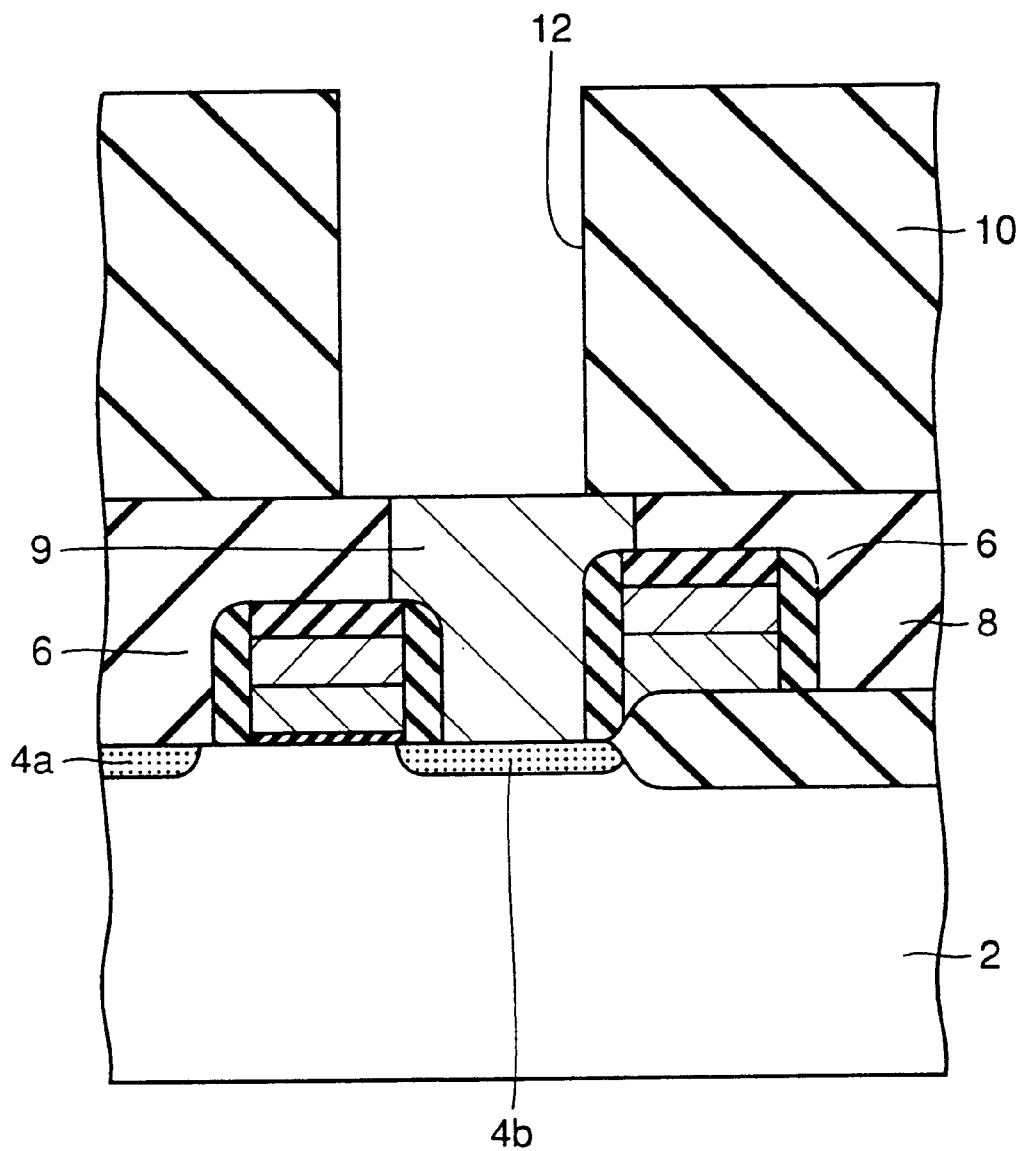
FIG. 1 is a cross sectional view illustrating a step of manufacturing a semiconductor device according to the first embodiment of the present invention.

A method of manufacturing a semiconductor device according to the first embodiment of the invention, and a DRAM as a semiconductor device obtained according to the method of manufacturing thereof will be described referring to the drawings. Referring now to FIG. 1, a single MOS transistor including a pair of source-drain regions $4a$ and $4b$ and a gate electrode portion 6 formed at a main surface of a semiconductor substrate 2 is formed according to the known method as illustrated in the description of the conventional art. The MOS transistor constitutes a switching element in a memory cell of the DRAM. A silicon oxide film 8 is deposited over semiconductor substrate 2 to cover gate electrode 6 by CVD or the like.

A contact hole that exposes the surface of source-drain region $4b$ is formed at silicon oxide film 8, and a plug 9 which is electrically connected to source-drain region $4b$ is formed of a polysilicon film or the like in the contact hole. An interlayer insulating film 10 formed of a silicon oxide film or the like with a thickness of approximately 1 $\mu$m is further formed on silicon oxide film 8 by CVD or the like. Prescribed photolithography and processing are applied to interlayer insulating film 10 to form an opening 12 that exposes the surface of plug 9.

Figure 2:
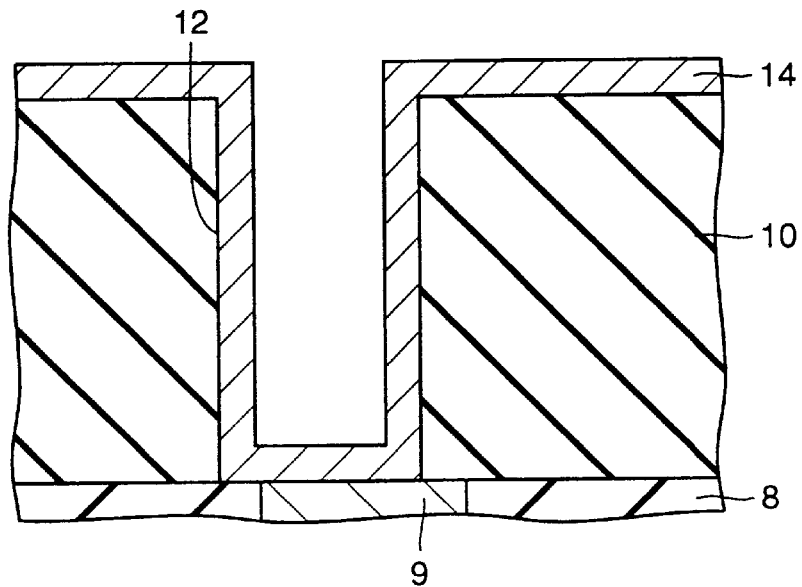
FIG. 2 is a cross sectional view illustrating a step performed after the step shown in FIG. 1 according to the first embodiment of the invention.

Referring next to FIG. 2, an amorphous silicon film 14 with a film thickness of approximately 500 Å is formed on interlayer insulating film 10 to cover an upper surface of interlayer insulating film 10, and a side surface and a bottom surface of opening 12 using inonosilane ($SiH_4$) gas under a temperature condition of 520° C.

Figure 3:
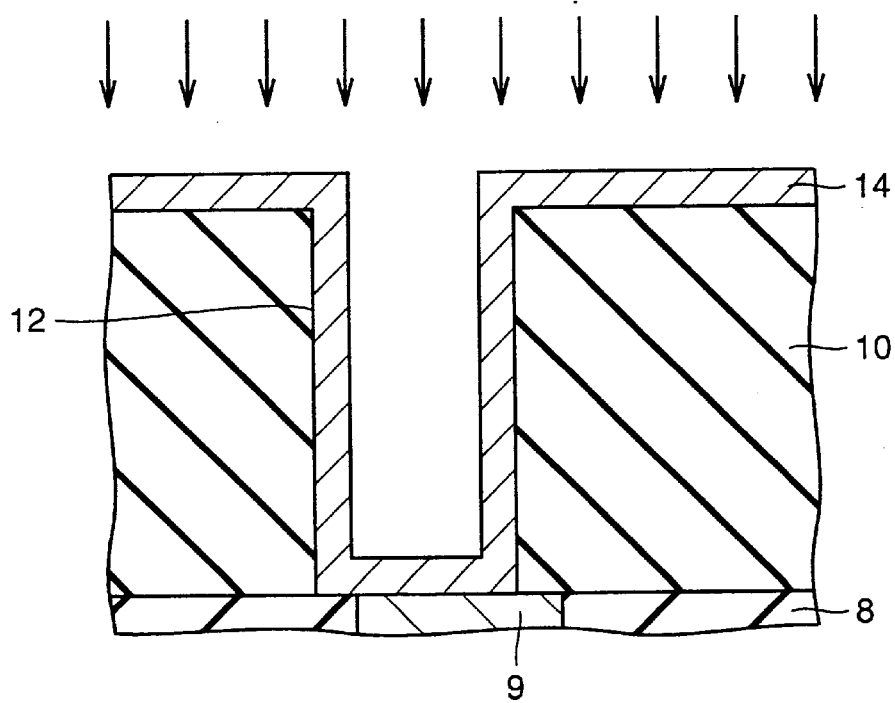
FIG. 3 is a cross sectional view illustrating a step conducted after the step shown in FIG. 2 according to the first embodiment of the invention.

Referring to FIG. 3, phosphorus ions are implanted almost vertically relative to semiconductor substrate 2 with an acceleration energy of 50 keV and dose of $4 \times 10^5/cm^2$. Phosphorus ions are thus implanted into amorphous silicon film 14 formed on the upper surface of interlayer insulating film 10 and on the bottom surface of opening 12.

Figure 4:
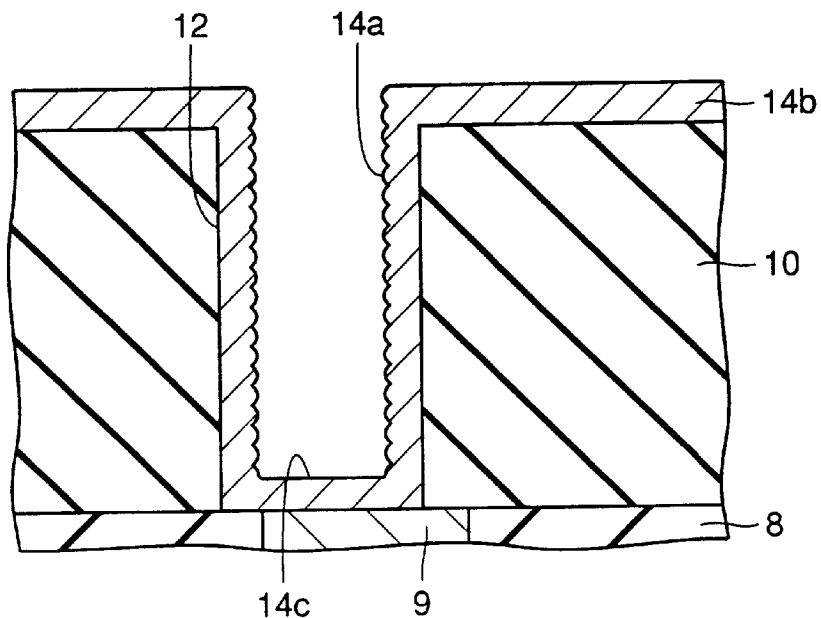
FIG. 4 is a cross sectional view illustrating a step conducted after the step shown in FIG. 3 according to the first embodiment of the invention.

Referring to FIG. 4, annealing is applied to amorphous silicon film 14 with a prescribed degree of vacuum according to the method described in, for example, "Growth Mechanism of Polycrystalline Si Films with Hemispherical Grains", (OYO BUTSURI, Vol. 61, No. 11, 1992, pp. 1147–1151). Crystal grains are grown at the surface of amorphous silicon film 14 by this annealing process. However, the phosphorus ions implanted into the amorphous silicon film 14 prevent crystal grains from growing at the portion where the phosphorus ions are implanted. Consequently, growth of the crystal grains is inhibited at amorphous silicon film 14 formed on the upper surface of interlayer insulating film 10, and an even polysilicon film 14b is formed.

Growth of the crystal grains is also inhibited at the portion of amorphous silicon film 14 formed on the bottom surface of opening 12. At the portion of amorphous silicon film 14 formed on the side surface of opening 12 where the phosphorus ions are not implanted, crystal grains grow to form an HSG polysilicon film 14a with hemispherical grains each having a diameter of approximately 30–100 nm is formed.

Figure 5:
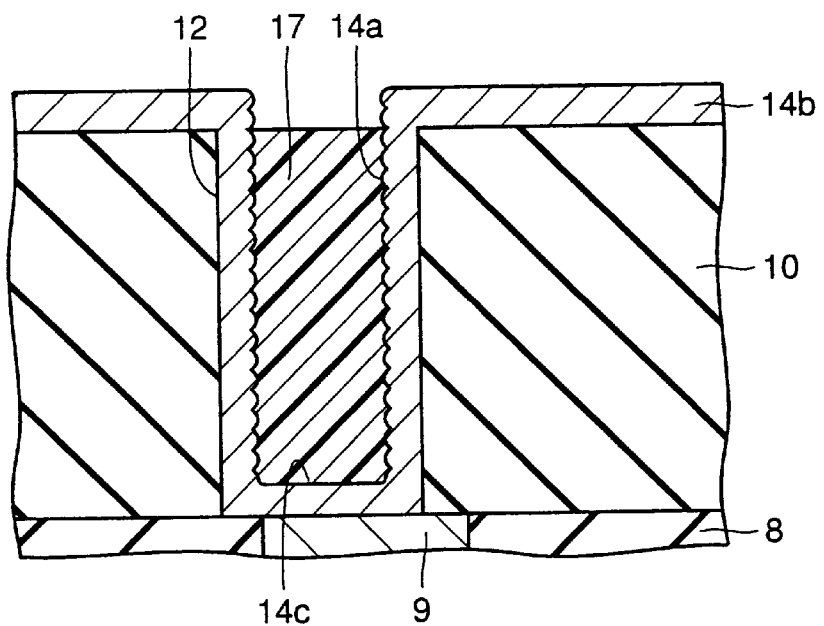
FIG. 5 is a cross sectional view illustrating a step conducted after the step shown in FIG. 4 according to the first embodiment of the invention.

Referring next to FIG. 5, a photoresist (not shown) is applied onto polysilicon film 14b to embed a photoresist 17 in opening 12 on which HSG polysilicon film 14a is formed. Polysilicon film 14b formed on the upper surface of interlayer insulating film 10 is etched away. Impurities of an appropriate conductive type are introduced into HSG polysilicon film 14a to form a storage node 16.

Figure 6:
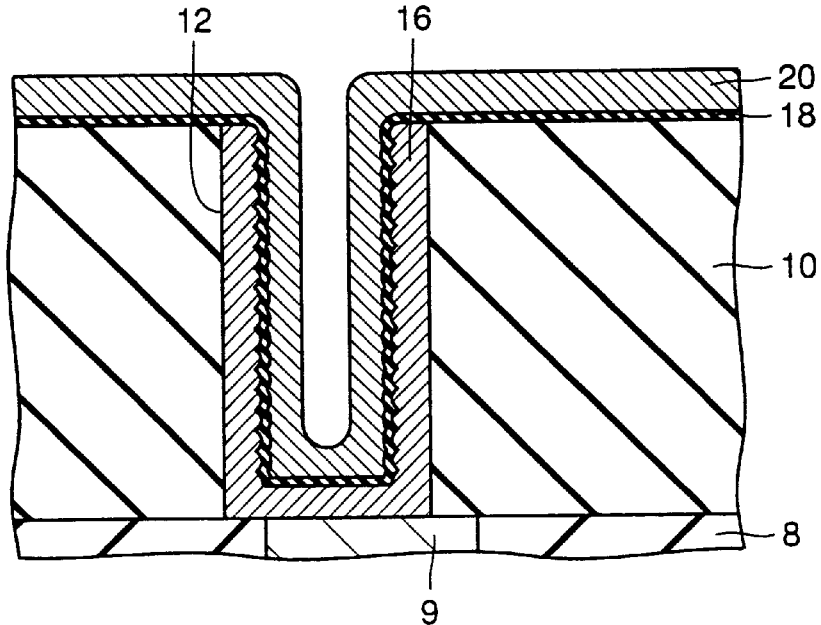
FIG. 6 is a cross sectional view illustrating a step conducted after the step shown in FIG. 5 according to the first embodiment of the invention.
Figure 7:
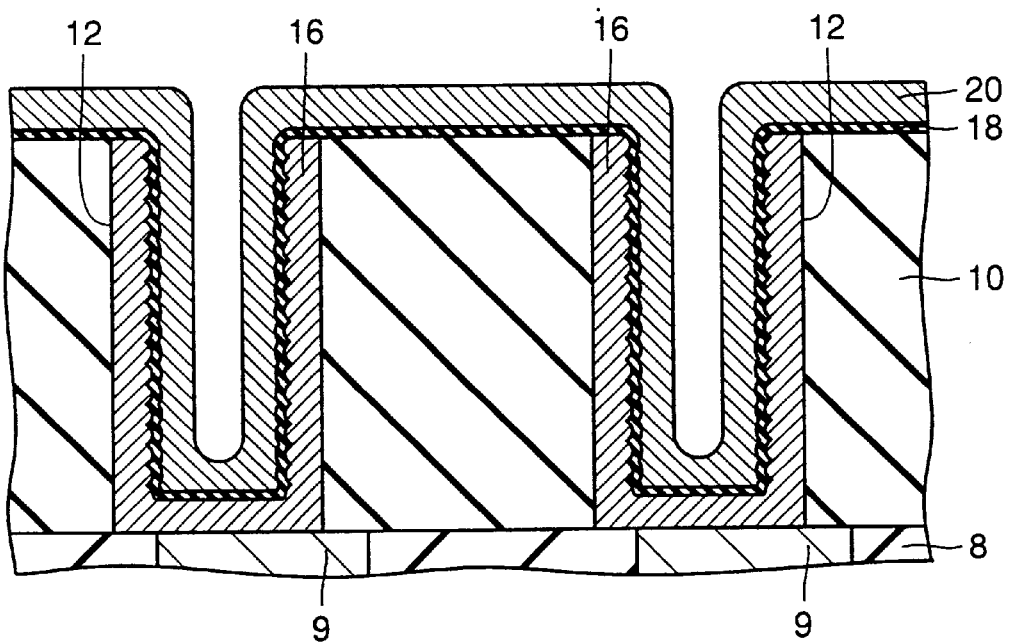
FIG. 7 is a cross sectional view provided for illustrating an effect of the semiconductor device according to the first embodiment of the invention.

Referring to FIG. 6, a capacitor dielectric film 18 is formed on storage node 16. A cell plate 20 formed of a polysilicon film or the like is formed on capacitor dielectric film 18. Storage node 16, capacitor dielectric film 18, and cell plate 20 constitute a capacitor. A main portion of a memory cell including one MOS transistor and one capacitor of a DRAM is thus fabricated. An interlayer insulating film (not shown) is thereafter formed to cover cell plate 20, and any metal interconnection line (not shown) and the like are formed on the interlayer insulating film to complete the DRAM.

According to the method of manufacturing a semiconductor device described above, phosphorus ions are implanted into amorphous silicon film 14 located on the upper surface of interlayer insulating film 10 in the step shown in FIG. 3, growth of crystal grains at the portion of amorphous silicon film 14 where phosphorus ions are implanted is prevented, and accordingly polysilicon film 14b having no hemispherical grain at its surface is formed. When polysilicon film 14b is etched away in the step shown in FIG. 5, generation of etching residue due to the hemispherical grains at the surface is restricted. As a result, residue of the polysilicon film is not left between adjacent storage nodes 16 and 16 to cause no electrical short-circuiting therebetween, and storage nodes 16 and 16 can be electrically isolated from each other suitably. Charges are appropriately accumulated in the capacitor of the memory cell of the DRAM fabricated according to the method described above, leading to improvement of the storage feature.

The phosphorus ions are almost vertically implanted relative to the semiconductor substrate in the step of ion implantation illustrated in FIG. 3 as described above in the DRAM, and accordingly the phosphorus ions could be implanted into amorphous silicon film 14 located on the bottom surface of opening 12. Growth of crystal grains is also prevented at the portion of amorphous silicon film 14 located on the bottom surface of opening 12. As a result, the size of hemispherical grains at the portion of amorphous silicon film 14 located on the bottom surface of opening 12 is thus smaller than the size of hemispherical grains formed at the portion of amorphous silicon film 14 located on the side surface of opening 12.

However, relatively large hemispherical grains could be formed at the surface of the portion of the amorphous silicon film 14 which is located on the bottom surface of opening 12 and is formed on the polysilicon film of the plug, depending on the shape of the surface of the polysilicon film of the plug, for example. In this case, the size of the hemispherical grains of the portion of storage node 16 located on the bottom surface of the opening could be larger than the size of the hemispherical grains of the portion of the storage node located on the side surface.

Second Embodiment

According to the method of manufacturing the semiconductor device described in the first embodiment, the phosphorus ions are almost vertically injected relative to semiconductor substrate 2. Therefore, the phosphorus ions are also implanted into the amorphous silicon film 14 formed on the bottom surface of opening 12. As a result, growth of crystal grains is prevented at amorphous silicon film 14 on the bottom surface of opening 12, and a polysilicon film which is roughened with hemispherical grains of a sufficient size could not be formed. In order to secure the capacitance of the capacitor, hemispherical grains are desirably formed at the portion of the amorphous silicon film on the bottom surface of opening 12. According to the second embodiment, a method is described of achieving formation of hemispherical grains at the portion of the amorphous silicon film located on the bottom surface of the opening, as the hemispherical grains at the portion of the amorphous silicon film formed on the side surface of the opening.

Figure 8:
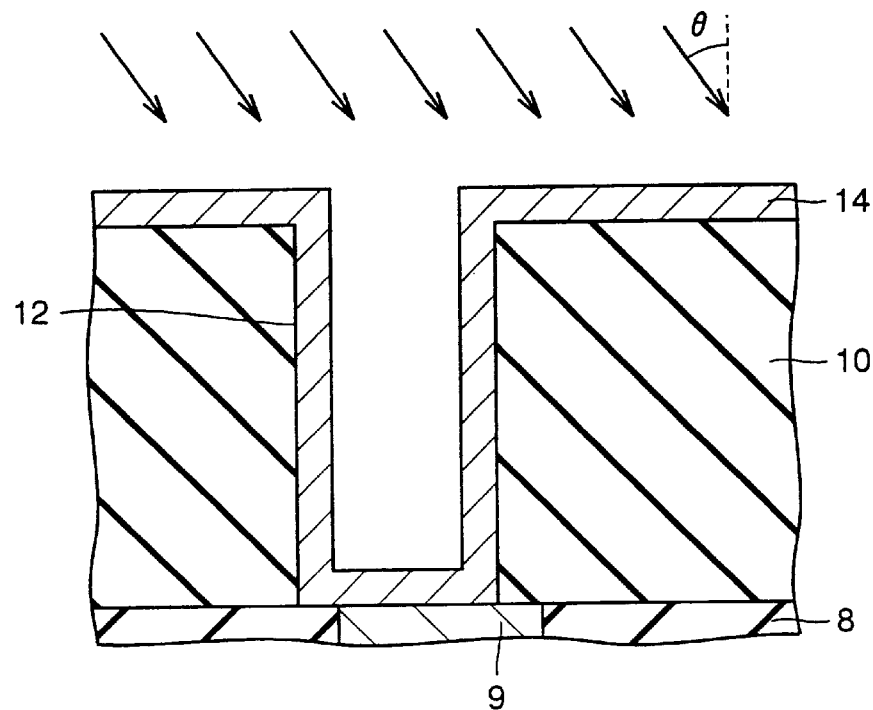
FIG. 8 is a cross sectional view showing a step of a method of manufacturing a semiconductor device according to the second embodiment.

Referring to FIG. 8, after the step illustrated in FIG. 2 and described according to the first embodiment, phosphorus ions are implanted into amorphous silicon film 14 with an angle of incidence θ using the acceleration energy and dose that are the same as those used in the process illustrated in FIG. 3. Consequently, phosphorus ions are blocked by the opening edge of opening 12 to be prevented from being implanted into amorphous silicon film 14 located on the bottom surface of opening 12.

Figure 9:
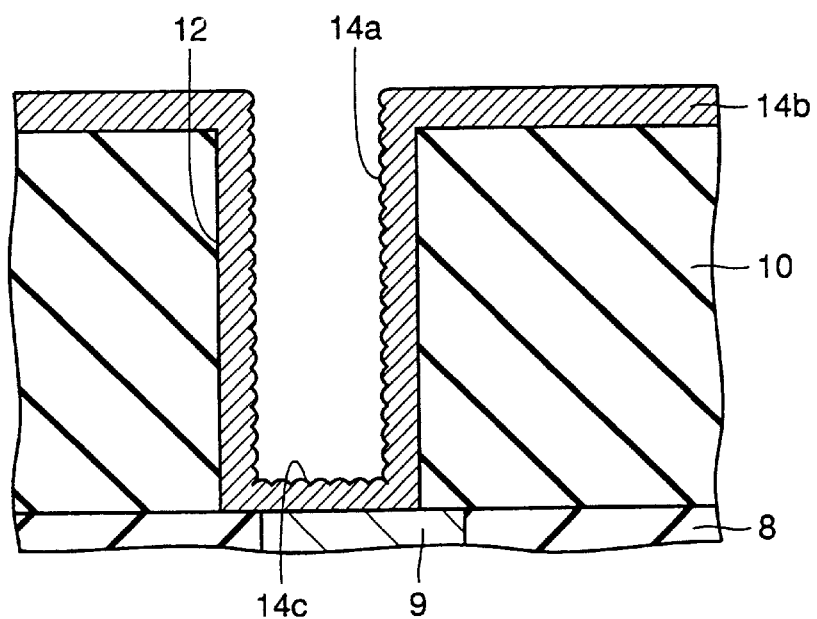
FIG. 9 is a cross sectional view illustrating a step performed after the step shown in FIG. 8 according to the second embodiment.

Referring next to FIG. 9, amorphous silicon film 14 is annealed under a condition which is the same as that used in the step shown in FIG. 4. The phosphorus ions are implanted into amorphous silicon film 14 located on the upper surface of interlayer insulating film 10 and not implanted into amorphous silicon film 14 located on the side surface and the bottom surface of opening 12. Crystal grains accordingly grow at amorphous silicon film 14 located on the side surface and the bottom surface of opening 12 to form HSG polysilicon films 14a and 14c. Growth of crystal grains is prevented at amorphous silicon film 14 located on the upper surface of interlayer insulating film 10, and a polysilicon film 14b having no hemispherical grains is thus formed.

Figure 10:
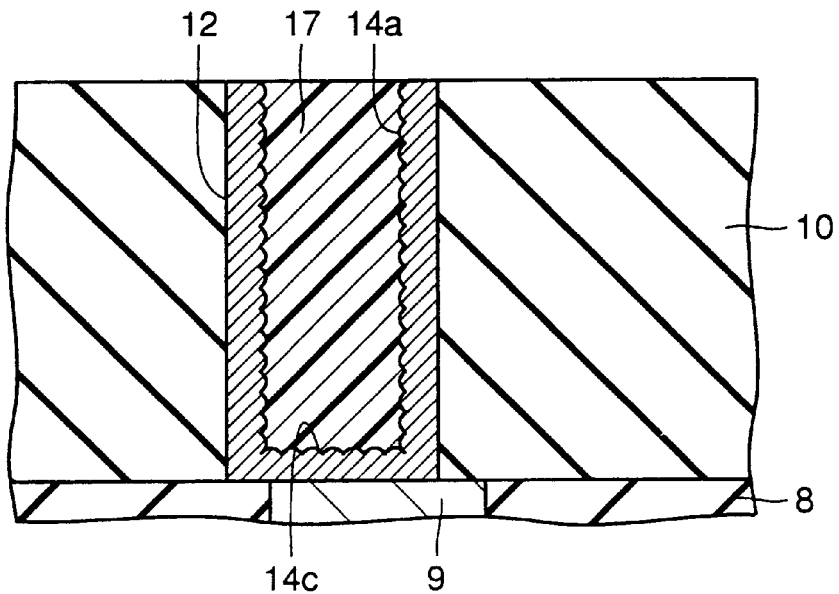
FIG. 10 is a cross sectional view illustrating a step performed after the step shown in FIG. 9 according to the second embodiment.

Referring to FIG. 10, polysilicon film 14b located on the upper surface of interlayer insulating film 10 is etched away as done in the step shown in FIG. 5. A photoresist 17 is thereafter removed and impurities of an appropriate conductivity are introduced into HSG polysilicon films 14a and 14c to complete a storage node 16.

Figure 11:
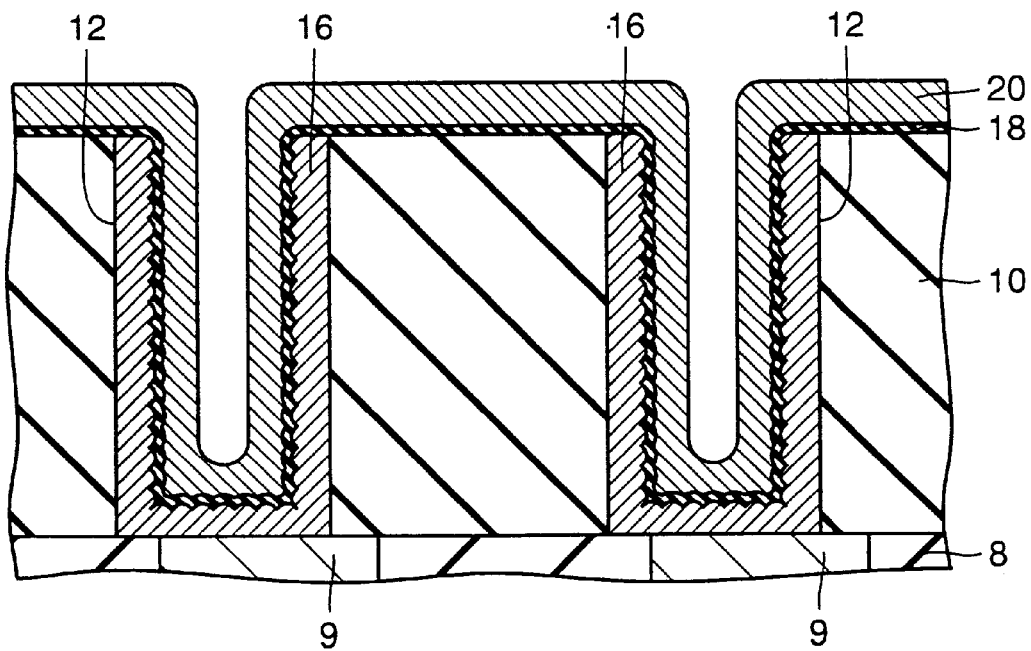
FIG. 11 is a cross sectional view illustrating a step performed after the step of FIG. 10 according to the second embodiment.
Figure 12:
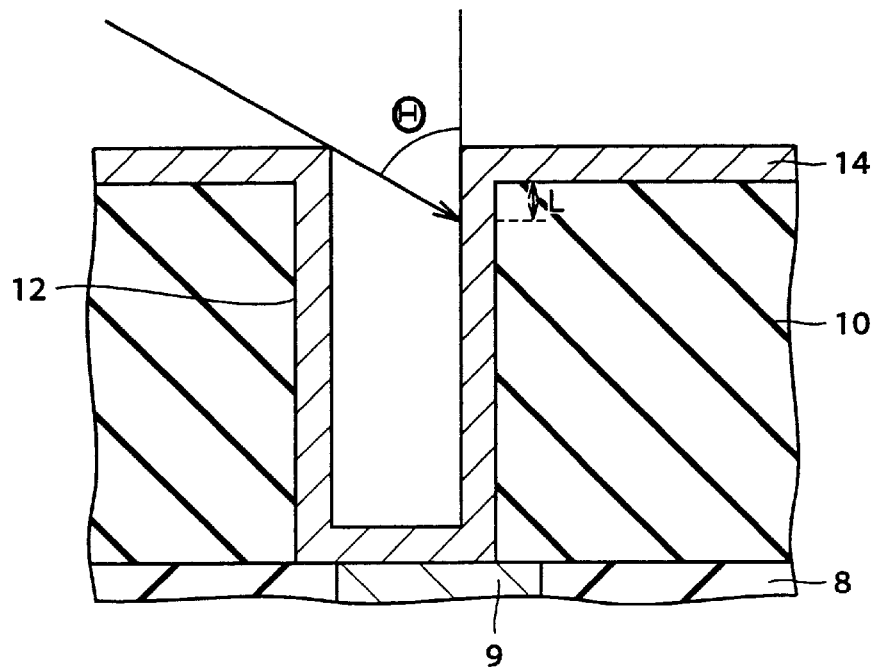
FIG. 12 is a cross sectional view illustrating a preferable arrangement of an angle of implantation according to the second embodiment of the invention.

Referring to FIG. 11, a cell plate 20 formed of a polysilicon film or the like is formed on storage node 16 with a capacitor dielectric film 18 interposed therebetween as done in the step illustrated in FIG. 6. A main portion of the memory cell of the DRAM is thus completed.

According to the manufacturing method described above, an effect of increase of the capacitance of the capacitor is achieved in addition to the effect described in the first embodiment, since hemispherical grains are formed at the portion of storage node 16 located on the bottom surface of opening 12.

According to the manufacturing method described above, phosphorus ions are injected with the angle of incidence θ relative to semiconductor substrate 2 in the step shown in FIG. 8. If the angle of incidence θ is relatively small, the phosphorus ions are implanted deep into opening 12 to prevent crystal grains of amorphous silicon from growing. It is desirable that the angle of incidence θ is larger than an angle θ between the normal of semiconductor substrate 2 and the line extending from the point of amorphous silicon film 14 located at the corner of opening 12 to the point of amorphous silicon film 14 located at distance L below the upper surface of interlayer insulating film 10. The distance L is desirably set to about 0.1 μm or less considering the accuracy of processing of the mask material and the accuracy of etching of the polysilicon film when the polysilicon film is etched.

At storage node 16 of the DRAM fabricated as described above, the polysilicon film located on the opening edge of opening 12 and on the upper surface of interlayer insulating film 10 where phosphorus ions are implanted to prevent growth of crystal grains is removed in the step illustrated in FIG. 10. However, depending on the condition of implantation and the etching condition of the polysilicon film, the polysilicon film where growth of crystal grains is prevented could remain to make the size of hemispherical grains of the HSG polysilicon film located in the opening in the vicinity of the opening edge of opening 12 smaller than the size of hemispherical grains of the HSG polysilicon film located on the bottom surface of opening 12 and located relatively deep on the side surface of opening 12.

Third Embodiment

Figure 13:
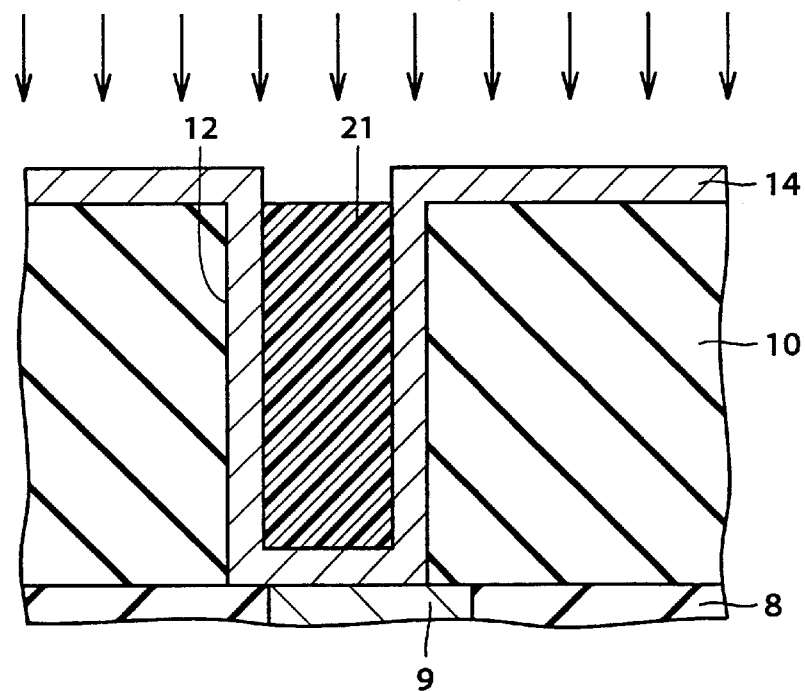
FIG. 13 is a cross sectional view illustrating a step of a method of manufacturing a semiconductor device according to the third embodiment of the invention.

A method of manufacturing a semiconductor device according to the third embodiment will now be described referring to the drawings. Referring to FIG. 13, after the step illustrated in FIG. 2 and described in the first embodiment, an implantation mask member 21 such as the photoresist is formed in opening 12 where amorphous silicon film 14 is formed. Implantation mask member 21 is easily formed to be self-aligned in opening 12 by applying photoresist onto amorphous silicon film 14 and entirely etching the photoresist to leave the resist in the opening. Phosphorus ions are implanted into amorphous silicon film 14 using implantation mask member 21 as mask with the acceleration energy and dose that are the same as those used in the step shown in FIG. 3. In this case, the phosphorus ions may be implanted obliquely or vertically relative to the semiconductor substrate. Accordingly, the phosphorus ions are implanted into amorphous silicon film 14 located on the upper surface of interlayer insulating film 10. Implantation mask member 21 is thereafter removed.

Figure 14:
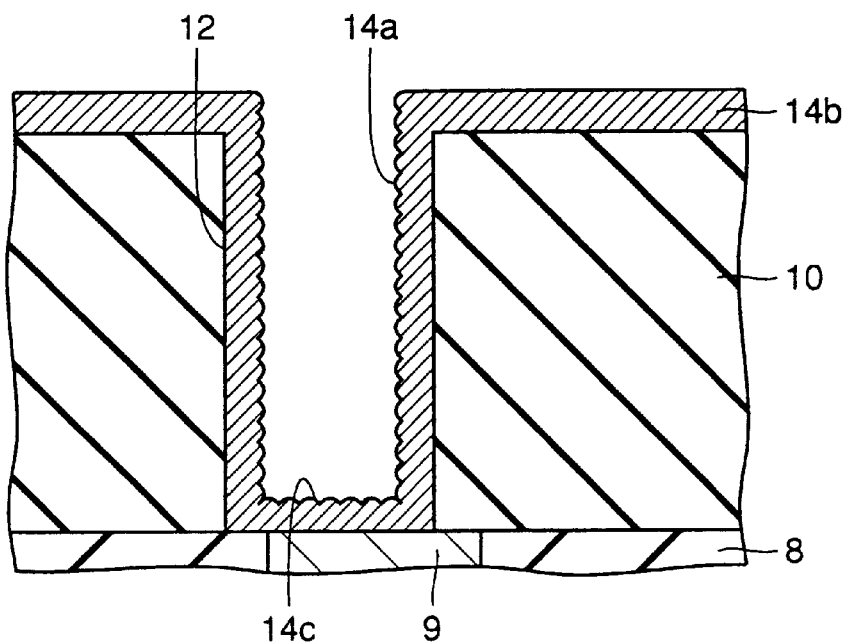
FIG. 14 is a cross sectional view illustrating a step conducted after the step shown in FIG. 13 according to the third embodiment of the invention.

Referring to FIG. 14, amorphous silicon film 14 is annealed under the condition which is the same as that used in the step shown in FIG. 4. At this time, the phosphorus ions are implanted into amorphous silicon film 14 located on the upper surface of interlayer insulating film 10 and they are not implanted into amorphous silicon film 14 located on the side surface and the bottom surface of opening 12. Therefore, crystal grains grow at amorphous silicon film 14 located on the side surface and the bottom surface of opening 12 to form HSG polysilicon films 14a and 14c. Growth of crystal grains is prevented at amorphous silicon film 14 located on the upper surface of interlayer insulating film 10 and a polysilicon film 14b having no hemispherical grain is formed. A main portion of a memory cell of a DRAM is thereafter completed through a step similar to that illustrated in FIG. 11 and described in the second embodiment.

According to the manufacturing method described above, storage nodes 16 are electrically isolated suitably and the capacitance of the capacitor can be increased further as described in the first and second embodiments.

Fourth Embodiment

The stacked trench structure is described as one example of the capacitor structure in the first to the third embodiments. A capacitor having a stacked capacitor structure other than the above stacked trench structure is described as the fourth embodiment.

Figure 15:
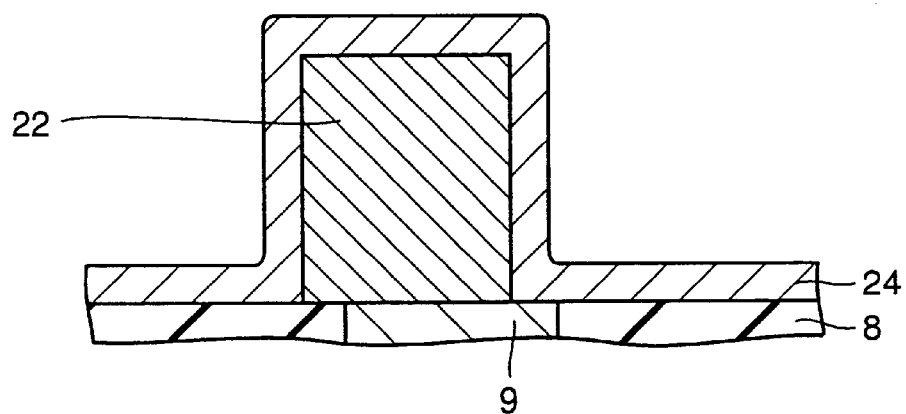
FIG. 15 is a cross sectional view illustrating a step of a method of manufacturing a semiconductor device according to the fourth embodiment of the invention.

Referring to FIG. 15, after plug 9 is formed at silicon oxide film 8 in the step illustrated in FIG. 1 and described in the first embodiment, a conductive portion 22 with a side surface and a top surface formed of a doped polysilicon film doped with phosphorus or the like is deposited on silicon oxide film 8. An amorphous silicon film 24 is formed on silicon oxide film 8 to cover conductive portion 22 by CVD.

Figure 16:
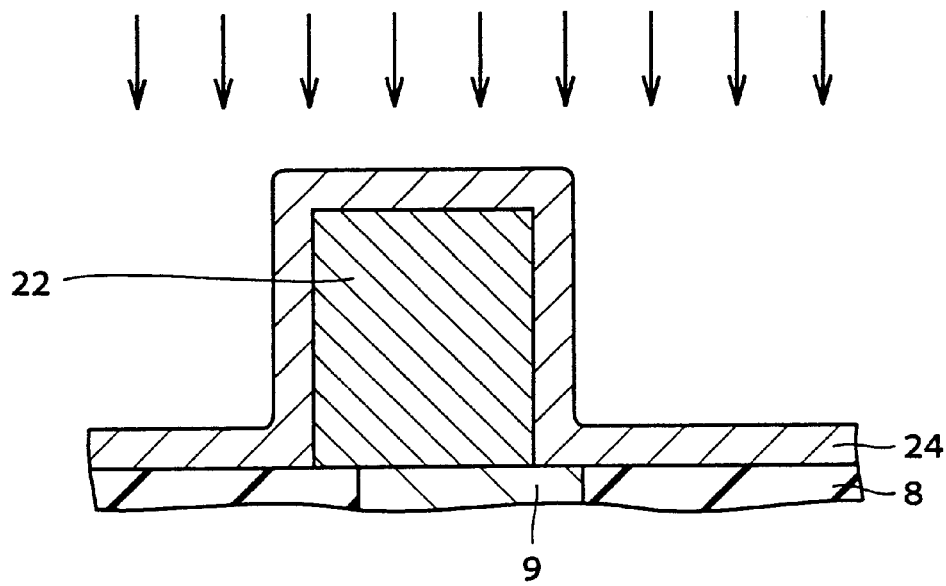
FIG. 16 is a cross sectional view illustrating a step conducted after the step shown in FIG. 15 according to the fourth embodiment.

Referring to FIG. 16, phosphorus ions are implanted into a portion of amorphous silicon film 24 located on the top surface of conductive portion 22 and into a portion of amorphous silicon film 24 located on silicon oxide film 8 under the implantation condition similar to that used in the step illustrated in FIG. 3 and described in the first embodiment. The phosphorus ions are not implanted into a portion of amorphous silicon film 24 located on the side surface of conductive portion 22.

Figure 17:
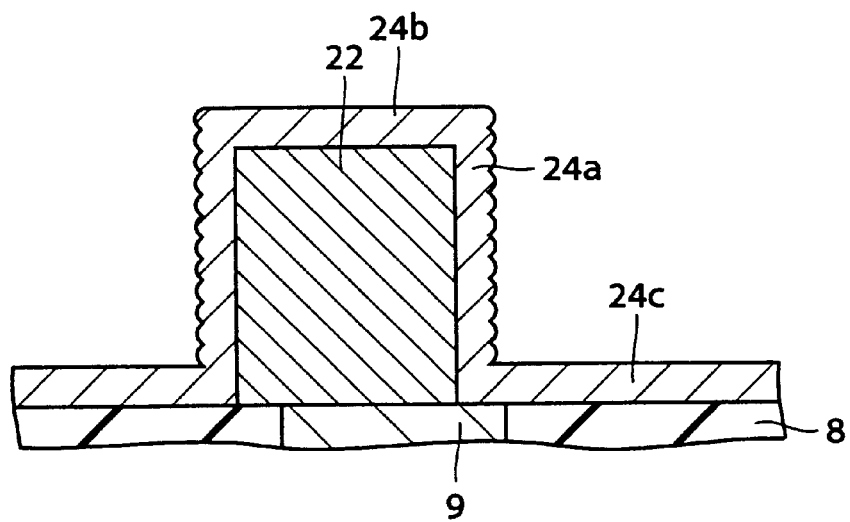
FIG. 17 is a cross sectional view illustrating a step conducted after the step shown in FIG. 16 according in the fourth embodiment.

Referring to FIG. 17, amorphous silicon film 24 is annealed under the condition which is the same as that used in the step illustrated in FIG. 4 and described in the first embodiment. At this time, the phosphorus ions are implanted into the portion of amorphous silicon film 24 located on the top surface of conductive portion 22 and the portion of amorphous silicon film 24 located on silicon oxide film 8, and the phosphorus ions are not implanted into the portion of amorphous silicon film 24 located on the side surface of conductive portion 22. Consequently, crystal grains grow at the portion of amorphous silicon film 24 located on the side surface of conductive portion 22 to form an HSG polysilicon film 24a. At those portions of amorphous silicon film 24 located on the top surface of conductive portion 22 and located on silicon oxide film 8, crystal grains are prevented from growing and polysilicon films 24b and 24c having no hemispherical grains are respectively formed.

Figure 18:
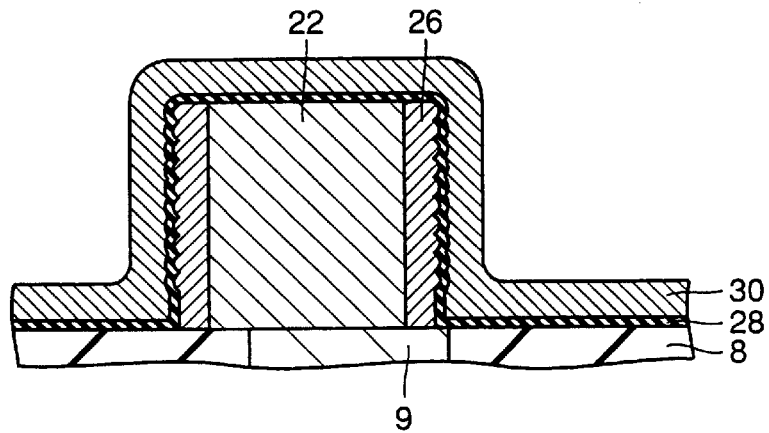
FIG. 18 is a cross sectional view illustrating a step conducted after the step shown in FIG. 17 in the fourth embodiment.
Figure 19:
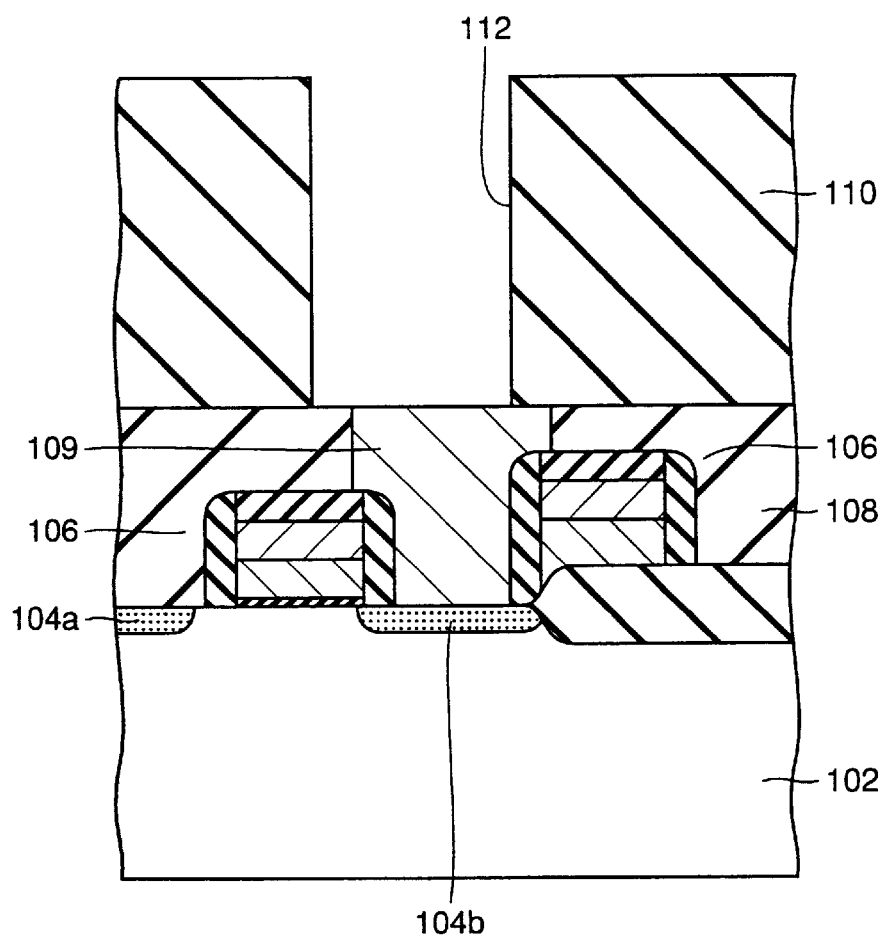
FIG. 19 is a cross sectional view illustrating a step of a method of manufacturing a conventional semiconductor device.
Figure 20:
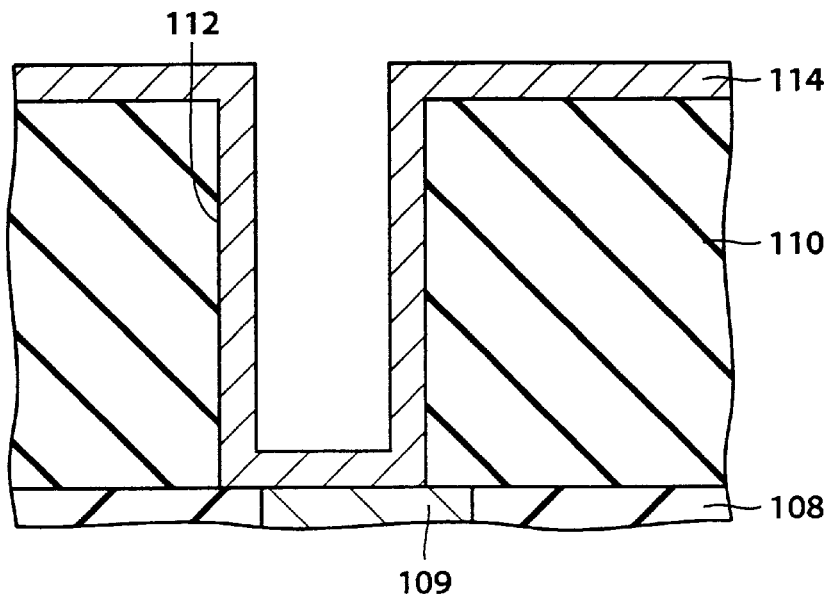
FIG. 20 is a cross sectional view illustrating a step conducted after the step shown in FIG. 19.
Figure 21:
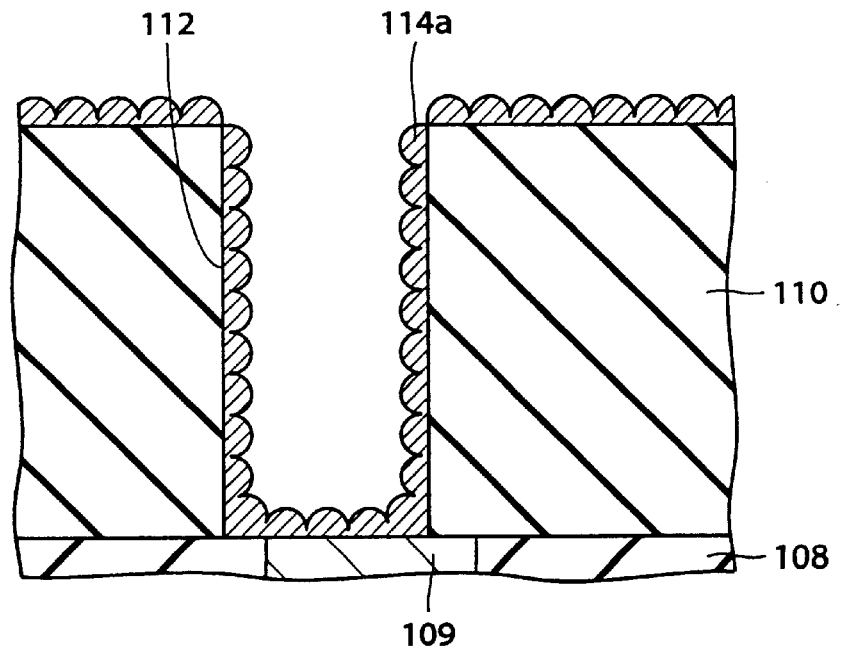
FIG. 21 is a cross sectional view illustrating a step conducted after the step shown in FIG. 20.
Figure 22:
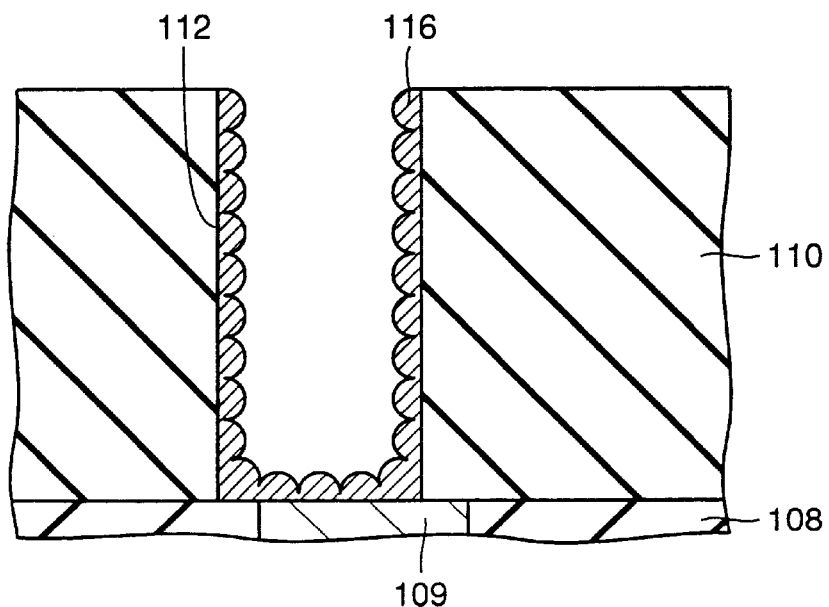
FIG. 22 is a cross sectional view illustrating a step conducted after the step shown in FIG. 21.
Figure 23:
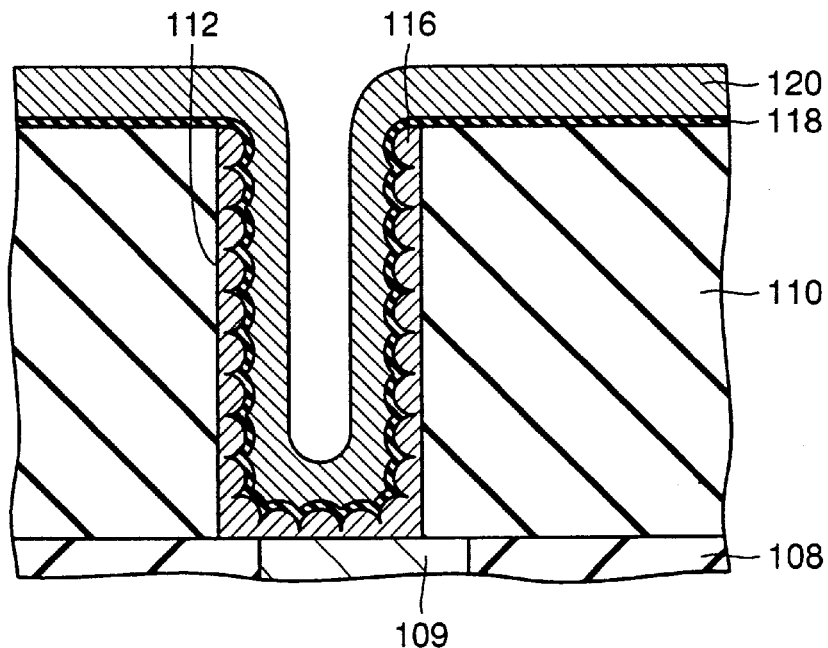
FIG. 23 is a cross sectional view illustrating a step conducted after the step shown in FIG. 22.
Figure 24:
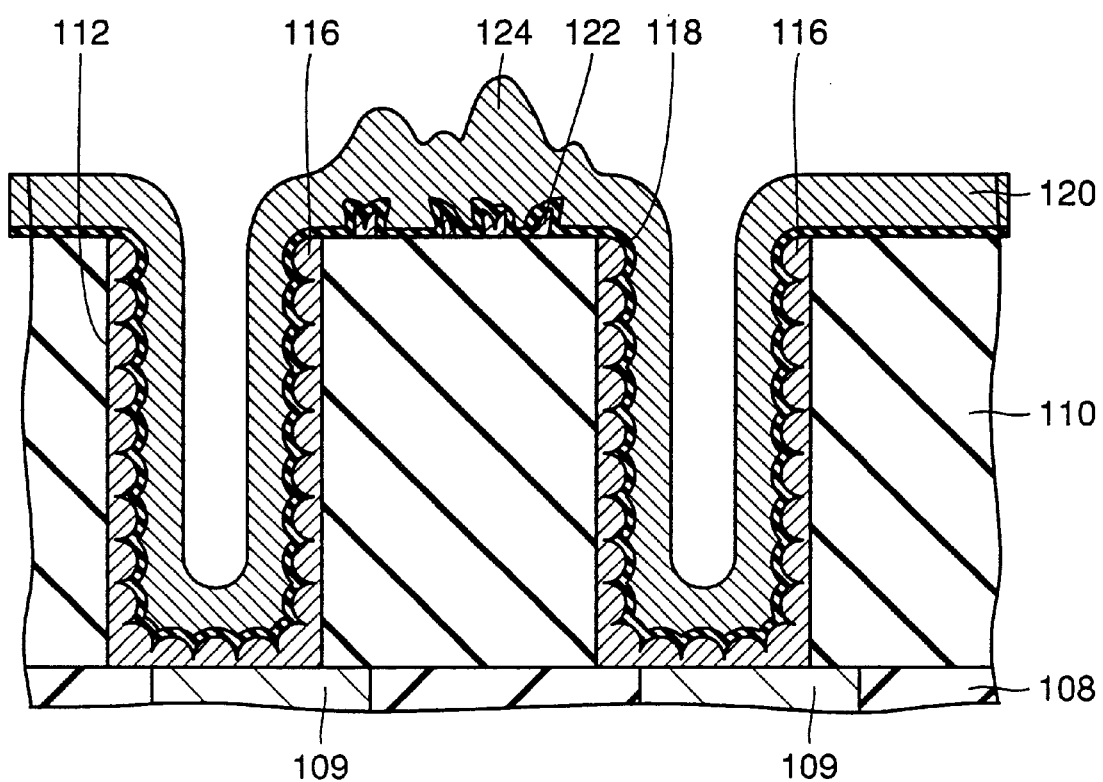
FIG. 24 is a cross sectional view provided for illustrating problems with the conventional semiconductor device.

Referring to FIG. 18, polysilicon film 24b located on the top surface of conductive portion 22 and polysilicon film 24c located on silicon oxide film 8 are removed by anisotropic etching. Impurities of a prescribed conductivity type are introduced into HSG polysilicon film 24b to form a storage node 26 including conductive portion 22. A cell plate 30 formed of a polysilicon film is deposited on storage node 26 with a capacitor dielectric film 28 interposed therebetween. A main portion of a memory cell of a DRAM is accordingly completed.

According to the manufacturing method described above, polysilicon film 24c having no hemispherical grains is formed at the portion of the amorphous silicon film located on silicon oxide film 8. When the polysilicon film 24c is removed by etching, generation of etching residue of the polysilicon film 24 due to hemispherical grains at the surface can be restricted. As a result, electrical short-circuiting due to presence of the residue of the polysilicon film between the storage node and another storage node (not shown) adjacent to each other can be prevented and those storage nodes can be electrically isolated appropriately as described in other embodiments. An effect similar to that described in the first embodiment can thus be obtained.

Although phosphorus ions are used as the impurity ions in respective embodiments described above, arsenic ions or silicon ions may be implanted. It has been confirmed that an effect similar to that described in each embodiment is achieved.

If a plug formed of a doped polysilicon film, for example, is formed to be electrically connected to the bottom of the storage node, it is desirable that impurity ions of the same conductivity type as that of the impurities used for doping of the plug are implanted. If the conductivity type of the plug is n type, phosphorus, arsenic, or the like is desirably implanted as described above. If the conductivity type of the plug is p type, it is desirable that boron or the like is implanted. In this case, reduction of the contact resistance between the storage node and the plug is possible.

Although the dose is described as $4 \times 10^{15}/cm^2$ in each embodiment as one example, it is found that an effect similar to that described in each embodiment is achieved by the dose of at least $1 \times 10^{15}/cm^2$. On the other hand, if the dose is greater than $1 \times 10^{16}/cm^2$, it takes much longer time for implantation to deteriorate the productivity. Therefore, the dose of $1 \times 10^{16}/cm^2$ is desirable as the maximum value of the dose.

Although photoresist 17 is formed in opening 12 where HSG polysilicon film 14a is formed in order to remove polysilicon film 14b in the first to the third embodiments, it is found that an SOG (Spin On Glass) film may be formed instead of the photoresist to achieve the similar effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

depositing a film that forms an electrode layer on a semiconductor substrate;

introducing impurities into a first portion of the film;

roughening a surface of said film by growing crystal grains at the surface other than the first portion;

forming a first electrode layer by removing said first portion of said film;

forming a dielectric layer on the first electrode layer; and forming a second electrode layer on said dielectric layer.

2. The method of manufacturing a semiconductor device according to claim 1, further comprising the steps of:

forming an insulating layer at a main surface of said semiconductor substrate;

forming an opening at said insulating layer;

depositing said film on side surface and a bottom surface of said opening and on an upper surface of said insulating layer; and introducing said impurities into said film located on the upper surface of said insulating layer.

3. The method of manufacturing a semiconductor device according to claim 2, wherein said step of introducing impurities includes an ion implantation step for implanting prescribed impurity ions.

4. The method of manufacturing a semiconductor device according to claim 2, further comprising a step of forming a conductive region of a prescribed conductivity type on said semiconductor substrate before depositing said prescribed film, wherein said step of forming the opening includes a step of exposing a surface of said conductive region, and said ion implantation step includes a step of implanting impurity ions of a conductivity type which is the same as the prescribed conductivity type of said conductive region.

5. The method of manufacturing a semiconductor device according to claim 3, wherein said ion implantation step includes a step of implanting said prescribed impurity ions obliquely relative to said semiconductor substrate.

6. The method of manufacturing a semiconductor device according to claim 3, wherein said ion implantation step includes a step of implanting said prescribed impurity ions using a mask member formed in said opening only as a mask.

7. The method of manufacturing a semiconductor device according to claim 5, wherein an angle of implantation is selected to allow said prescribed impurities to be implanted into said prescribed film located at an opening edge of said opening and located in the vicinity of the opening edge in said ion implantation step.

8. The method of manufacturing a semiconductor device according to claim 1, comprising introducing said impurities by ion implantation.

9. The method of manufacturing a semiconductor device according to claim 8, wherein dose of said ion implantation step is not less than $1 \times 10^{15}/cm^2$ and not more than $1 \times 10^{16}/cm^2$.

10. A semiconductor device comprising:

a semiconductor substrate having a main surface;

an insulating layer formed at said main surface of said semiconductor substrate;

an opening formed at said insulating layer to expose the main surface of said semiconductor substrate;

a first electrode layer roughened to have hemispherical grains which is formed on a side surface and a bottom surface of said opening; and a second electrode layer formed on said first electrode layer with a dielectric layer interposed therebetween, wherein the size of hemispherical grains formed at a surface of a portion of said first electrode layer located on said side surface of said opening and the size of hemispherical grains formed at a surface of a portion of said first electrode layer located on said bottom surface are different from each other.

11. A semiconductor device comprising:

a semiconductor substrate having a main surface;

an insulating layer formed at said main surface of said semiconductor substrate;

an opening formed at said insulating layer to expose the main surface of said semiconductor substrate;

a first electrode layer roughened to have hemispherical grains which is formed on a side surface and a bottom surface of said opening; and a second electrode layer formed on said first electrode layer with a dielectric layer interposed therebetween, wherein the size of hemispherical grains formed at a portion of said first electrode layer located at an opening edge of said opening and located in the vicinity of the opening edge and the size of hemispherical grains formed at a portion of said first electrode layer other than the portion located at the opening edge of said opening and located in the vicinity of the opening edge are different from each other.

* * * * *